United States Patent [19]
Nagashima

[11] Patent Number: 5,312,773
[45] Date of Patent: May 17, 1994

[54] METHOD OF FORMING MULTILAYER INTERCONNECTION STRUCTURE

[75] Inventor: Naoki Nagashima, Kanagawa, Japan

[73] Assignee: Sony Corporation, Tokyo, Japan

[21] Appl. No.: 37,640

[22] Filed: Mar. 26, 1993

[30] Foreign Application Priority Data

Apr. 3, 1992 [JP] Japan .................................. 4-081285

[51] Int. Cl.⁵ .......................................... H01L 21/44
[52] U.S. Cl. .................................... 437/190; 437/192; 437/193; 437/195
[58] Field of Search ................. 437/190, 195, 192, 193

[56] References Cited

U.S. PATENT DOCUMENTS

| | | | |
|---|---|---|---|
| 4,963,511 | 10/1990 | Smith | 437/192 |
| 4,977,105 | 12/1990 | Okamoto et al. | 437/190 |
| 5,006,484 | 4/1991 | Harada | 437/192 |
| 5,143,861 | 9/1992 | Turner | 437/192 |

FOREIGN PATENT DOCUMENTS

4-373149 12/1992 Japan .

Primary Examiner—Brian E. Hearn
Assistant Examiner—Laura M. Holtzman
Attorney, Agent, or Firm—Hill, Steadman & Simpson

[57] ABSTRACT

The disclosure relates to a method of forming a multilayer interconnection structure. The structure is a laminated body having a first conductive layer, a first insulating layer, a second conductive layer and a second insulating layer in an ascending order. In the method, firstly, a through-hole is formed on the laminated body so as to expose a surface of the first conductive layer and two opposed surfaces of the second conductive layer. Then, the two opposed surfaces of the second conductive layer is masked with a masking film, so as not to deposit thereon a conductive material which has a strong and selective adhesion on the first and second conductive layers. Then, the conductive material is deposited on the surface of the first conductive layer by a chemical vapor deposition method so as to fill a lower portion of the through-hole with the conductive material. Then, the masking film is removed so as to expose the two opposed surfaces of the second conductive layer. Then, the conductive material is deposited on the two opposed surfaces of the second conductive layer by the chemical vapor deposition method so as to fill an upper portion of the through-hole with the conductive material, such that the through-hole is filled with the conductive material and that the first and second conductive layers are interconnected with each other.

13 Claims, 5 Drawing Sheets

METHOD OF FORMING MULTILAYER INTERCONNECTION STRUCTURE

BACKGROUND OF THE INVENTION

1. Field of the Invention

The present invention relates in general to a method of forming a multilayer interconnection structure, and more particularly to a method of filling a through-hole with a conductive material by a chemical vapor deposition (CVD) method so as to obtain a multilayer interconnection.

2. Description of the Prior Art

A multilayer or three dimensional interconnection structure of a semiconductor device has been recently proposed to minimize the interconnection resistance and to save valuable chip area.

It is known to form a multilayer interconnection structure by a selective CVD method with using tungsten. This method comprises the following steps in the sequence.

First, a first insulating layer is deposited on a first conductive layer, followed by the deposition of a second conductive layer on the first insulating layer. Then, a second insulating layer is deposited on the second conductive layer, so as to form a multilayer structure. Then, a through-hole is formed on the multilayer structure so as to expose an upper surface of the first conductive layer. The first and second conductive layers are made of polycrystaline silicon (polysilicon), and the first and second insulating layers are made of $SiO_2$. Then, a conductive material such as tungsten is deposited in the through-hole using a selective CVD method. It is noted that tungsten is selectively deposited on polysilicon surface by the CVD method, and not on $SiO_2$ surface. Due to this characteristic of tungsten, it can be selectively deposited on the exposed upper surface of the first conductive layer and on two exposed side surfaces of the second conductive layer. If a through-hole has a relatively low aspect ratio, the through-hole will be filled with tungsten by growing tungsten deposition. However, due to a recent demand for high integration of semiconductor devices, the through-hole has a relatively high aspect ratio. Due to this, the through-hole tends to be blocked up by the growth of tungsten deposition on the side surfaces of the second conductive layer. With this, an undesirable void space is left in the through-hole. This space makes the first and second conductive layers unconnected with each other.

To prevent the formation of the void space, as is disclosed in Japanese Patent No. 4-373149, there is another conventional method of forming a multilayer interconnection structure. This method having the following steps in the sequence will be described with reference to FIGS. 8 and 9.

First, a multilayer structure 10 is formed by depositing on a first conductive layer (polysilicon film) 12 a first insulating layer ($SiO_2$ film) 14, a second conductive layer (Si film) 16 and a second insulating layer ($SiO_2$ film) 18 in turn. Then, a through-hole 20 is formed on the multilayer structure 10 so as to expose an upper surface of the first conductive layer 12 and side surfaces of the second conductive layer 16. Then, a $SiO_2$ film 22 is deposited on an upper surface of the second insulating layer 18 and on the through-hole 20. After that, the deposited $SiO_2$ film 22 was partially removed so as to leave only its side wall portion on the through-hole 20.

Then, as is seen from FIG. 8, tungsten is selectively deposited by a CVD method on the upper surface of the first conductive layer 12 in a vertical direction until the top surface of the deposited tungsten 24 reaches a height just below that of a bottom surface of the second conductive layer 16. Then, upper portions of the side wall portions of the $SiO_2$ film 22 are removed by isotropic etching so as to expose the side surfaces of the second conductive layer 16. Then, tungsten is selectively deposited by a CVD method on the side surfaces of the second conductive layer 16 so as to fill the through-hole with tungsten. However, as is seen from FIG. 9, the second conductive layer of Si film 16 is eroded by the reducing effect of the CVD method. This may lead the increase of junction leak of a transistor. Furthermore, electric contact resistance of Si or polysilicon relative to tungsten is higher than that relative to Al or Ti. In particular, as the thickness of the second conductive layer of Si film 16 becomes thinner, parasitic resistance of a transistor is increased when tungsten is used for interconnecting a multilayer structure.

SUMMARY OF THE INVENTION

It is therefore an object of the present invention to provide an improved method of forming a multilayer interconnection structure, in which Si and polysilicon in the through-hole are not eroded and in which contact resistance is decreased.

According to the present invention, there is provided a method of forming a multilayer interconnection structure, said method comprising the following steps in the sequence:

(a) depositing a first insulating layer on a first conductive layer, followed by the deposition of a second conductive layer on said first insulating layer;

(b) depositing a second insulating layer on said second conductive layer;

(c) forming a through-hole by opening said second insulating, second conductive and first insulating layers so as to expose a surface of said first conductive layer and two opposed surfaces of said second conductive layer, said through-hole having a first portion in which the surface of said first conductive layer is exposed and a second portion in which the two opposed surfaces of said second conductive layer are exposed;

(d) masking the two opposed surfaces of said second conductive layer with a masking film, so as not to deposit thereon a conductive material which has a strong and selective adhesion on said first and second conductive layers;

(e) depositing said conductive material on the surface of said first conductive layer by a selective chemical vapor deposition method so as to fill the first portion of said through-hole with said conductive material;

(f) removing said masking film so as to expose the two opposed surfaces of said second conductive layer; and (g) depositing said conductive material on the two opposed surfaces of said second conductive layer by the selective chemical vapor deposition method so as to fill the second portion of said through-hole with said conductive material, such that said through-hole is substantially filled with said conductive material and that said first and second conductive layers are interconnected with each other.

DESCRIPTION OF THE PREFERRED EMBODIMENTS

Figure 7:
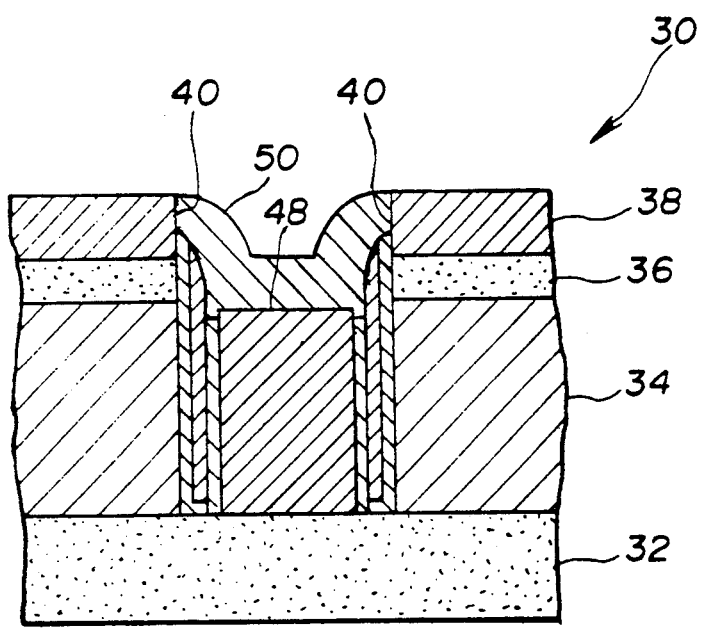
Figure 8:
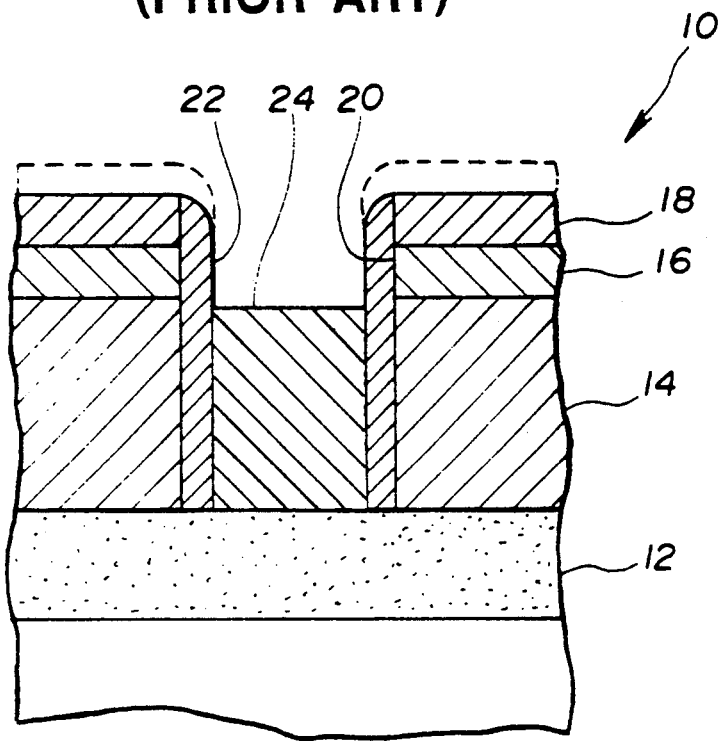
FIGS. 8 and 9 are views which are similar to FIGS. 1 to 7, but showing sequential steps of forming a conventional multilateral interconnection structure.
Figure 9:
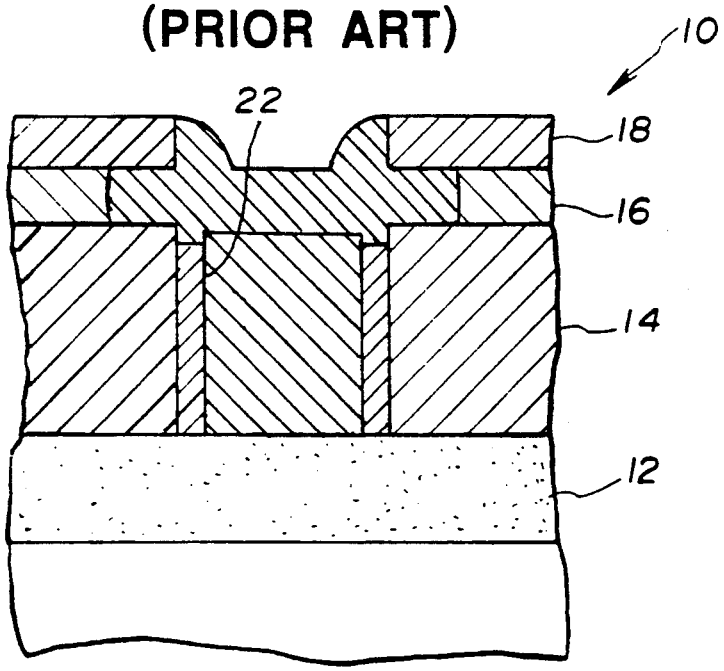

As is seen from FIG. 7, there is provided a multilayer interconnection structure 30 according to the present invention. This structure comprises a first conductive layer 32, a first insulating layer 34, a second conductive layer 36 and a second insulating layer 38. The first and second conductive layers 32, 36 are made of polysilicon, and the first and second insulating layers 34, 38 are made of $SiO_2$. The first and second conductive layers 32, 36 and the first and second insulating layers 34, 38 are, for example, 300 nm, 150 nm, 600 nm and 250 nm in thickness, respectively.

The multilayer interconnection structure 30 is formed with a through-hole 40 which is filled with a conductive material such as tungsten. The through-hole 40 has a width, for example, in a range from 0.5 to 0.9 $\mu$m, the width being defined along a horizontal direction parallel to an upper surface of the first conductive layer 32.

Referring to FIGS. 1 to 7, a method of forming the multilayer interconnection structure 30 in accordance with the present invention will be described. This method comprises the following steps in the sequence.

First, the first conductive layer 32 is deposited on a substrate (not shown), followed by the deposition of the first insulating layer 34 on the first conductive layer 32. Then, the second conductive layer 36 is deposited on the first insulating layer 34, followed by the deposition of the second insulating layer 38 on the second conductive layer 36. With this, a multilayer structure 30 is formed, without having an interconnection between the first and second conductive layers 32 and 36.

Figure 1:
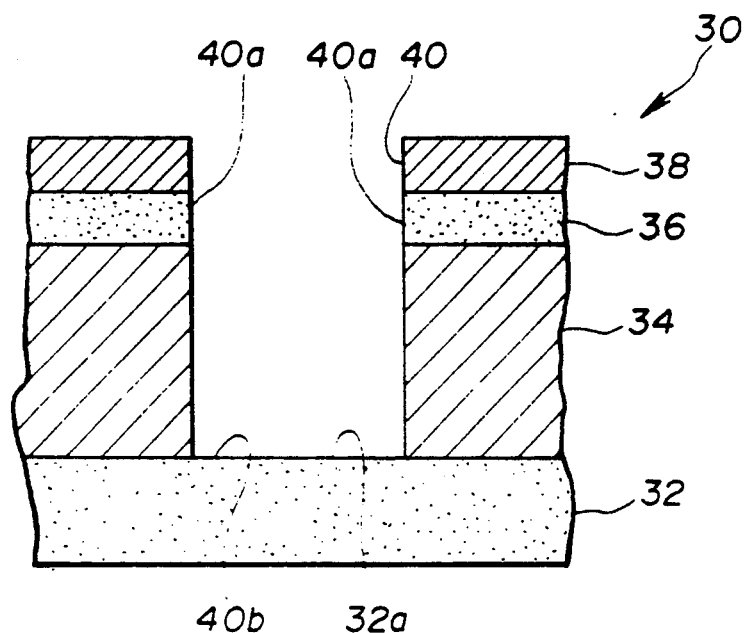
FIGS. 1 to 7 are elevational and sectional views, showing sequential steps of forming a multilayer interconnection structure in accordance with the present invention.

Then, as is seen from FIG. 1, the through-hole 40 is formed on the multilayer structure 30 so as to expose the upper surface 32a of the first conductive layer 32 through photolithography and dry etching techniques. The through-hole 40 defines two opposed side wall portions 40a and a bottom wall portion 40b.

Figure 2:
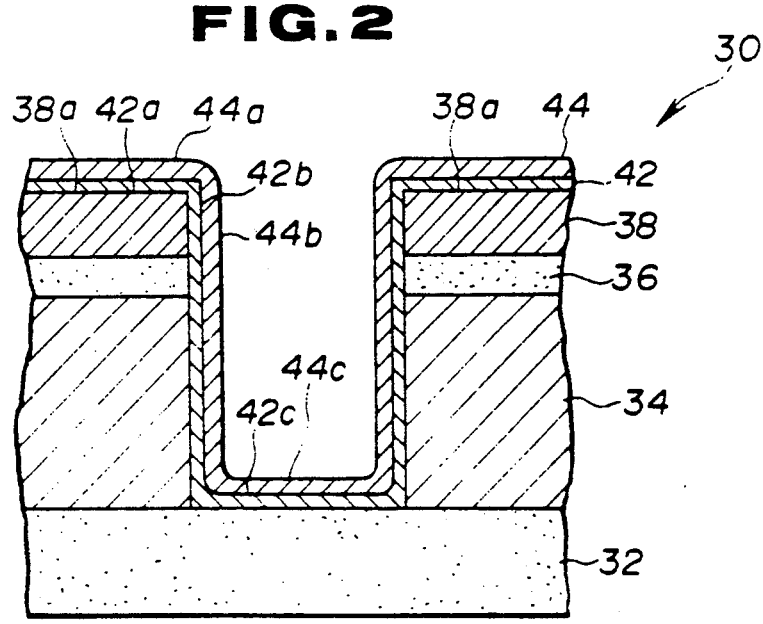

Then, as is seen from FIG. 2, a Ti film 42 and a TiON film 44 having 50 nm thicknesses respectively are deposited on an upper surface 38a of the second insulating layer 38 and the side wall portions 40a and the bottom wall portion 40b of the through-hole 40. Thus, the deposited Ti and TiON films 42, 44 comprise upper wall portions 42a, 44a, side wall portions 42b, 44b and a bottom wall portion 42c, 44c.

Figure 3:
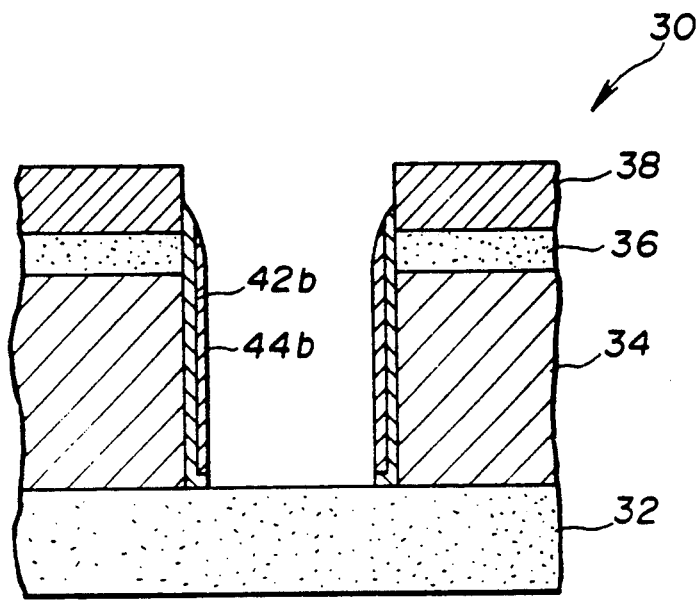

Then, as is seen from FIG. 3, the upper wall portions 42a, 44a and the bottom wall portions 42c, 44c of the Ti and TiON films 42, 44 are removed by reactive ion etching (RIE) as an etch back technique, with leaving only the side wall portions 42b, 44b of the films 42, 44. RIE is conducted in accordance with, for example, the following conditions:

Source gases and their flow rates: $BCl_3$ (80 SCCM) and $Cl_2$ (10 SCCM);
Pressure: $2.2 \times 10^{-2}$ Bar;
Power: 900 W; and
Etching time: 15 sec.

After RIE, a $SiO_2$ film 46 having a thickness of, for example, 50 nm, is deposited, by a CVD method, on the upper surface 38a of the second insulating layer 38, the Ti and TiON films 42 and 44 and the upper surface 32a of the first conductive layer 32.

Figure 4:
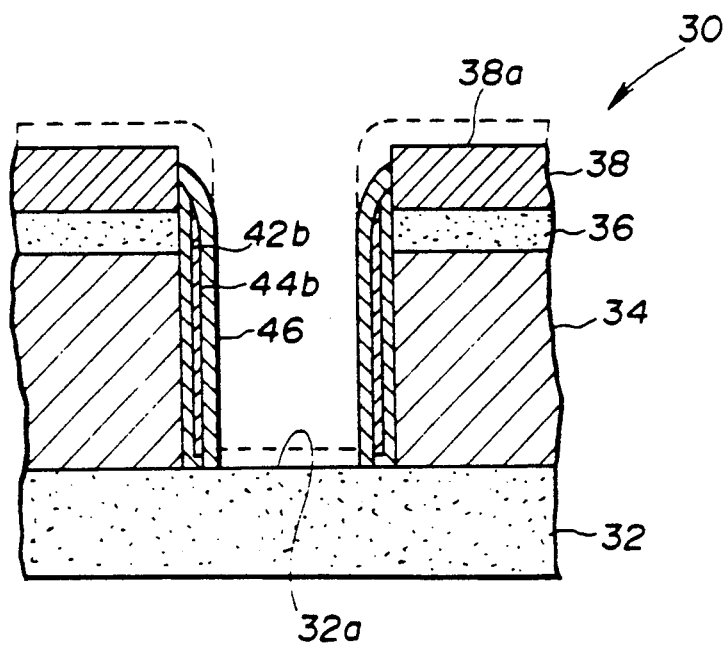

Then, as is seen from FIG. 4, the $SiO_2$ film 46 was removed by RIE as an etch back technique so as to leave only the side wall portions of the $SiO_2$ film 46 and so as not to expose the Ti and TiON films 42, 44. RIE is conducted in accordance with, for example, the following conditions:

Source gases and their flow rates: oxygen ($O_2$, 8 SCCM) and methane trifluoride ($CHF_3$, 75 SCCM);
Pressure: $6.8 \times 10^{-2}$ Bar;
Power: 1150 W; and
Etching time: terminal detection.

Prior to deposition of tungsten on the upper surface 32a of the first conductive layer 32, a preliminary cleaning treatment such as a wet etching or a dry etching is conducted. As the wet etching, the multilayer structure 30 is treated, for example, with an aqueous mixture of $H_2SO_4$-$H_2O_2$ for 10 min, or with a light etching using a mixture of $H_2O$ and HF in the ratio of 100 to 1 for 30 sec. As the dry etching, for example, a $N_2$ plasma etching or a $H_2$ plasma etching is conducted. The $N_2$ plasma etching is conducted in accordance with, for example, the following conditions:

Source gases and their flow rates: $N_2$ (50 SCCM), $NF_3$ (5 SCCM) and Ar (5 SCCM);
Power: 88 W (0.5 W/cm$^2$); and
Temperature: up to 100° C.

The $H_2$ plasma etching is conducted in accordance with, for example, the following conditions:

Source gases and their flow rates: $H_2$ (50 SCCM), $NF_3$ (10 SCCM) and Ar (5 SCCM);
Power: 88 W (0.5 W/cm$^2$); and
Temperature: up to 100°.

Figure 5:
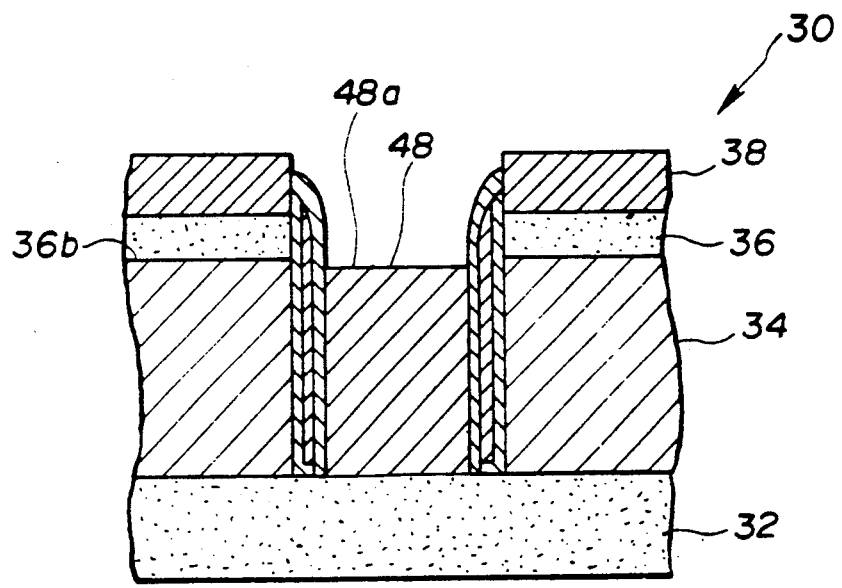

As is seen from FIG. 5, after the preliminary cleaning treatment, tungsten is selectively deposited by a CVD method on the upper surface 32a of the first conductive layer 32 in a vertical direction perpendicular to the upper surface 32a of the first conductive layer 32, until the top surface 48a of the deposited tungsten 46 reaches a height just below that of a bottom surface 36b of the second conductive layer 36. It should be noted that tungsten has poor adhesion on $SiO_2$ surface and strong adhesion on polysilicon surface. Thus, tungsten is selectively deposited on the first polysilicon conductive layer 32 in the vertical direction. This deposition manner does not lead to the formation of a void space in the deposited tungsten 48.

As the above-mentioned CVD method to selectively deposit tungsten, for example, a so-called silane reduction method using silane as a reducing agent, or a so-called hydrogen reduction method using hydrogen as a reducing agent is used.

The silane reduction method is conducted in accordance with, for example, the following conditions:

Source gases and their flow rates: silane ($SiH_4$, 7 SCCM), argon (Ar, 15 SCCM), tungsten hexafluoride ($WF_6$, 10 SCCM) and hydrogen ($H_2$, 1000 SCCM); and
Temperature: 260° C. (240°-280° C.).

The hydrogen reduction method has two stages having two different tungsten hexafluoride flow rates. The first stage is conducted in accordance with, for example, the following conditions:

Source gases and their flow rates: hydrogen (H$_2$, 500 SCCM), argon (Ar, 10 SCCM), and tungsten hexafluoride (WF$_6$, 0.5 SCCM); and
Temperature: 420°–470° C.

The second stage is conducted in accordance with, for example, the following conditions:

Source gases and their flow rates: hydrogen (H$_2$, 500 SCCM), argon (Ar, 10 SCCM), and tungsten hexafluoride (WF$_6$, 5 SCCM); and
Temperature: 420°–470° C.

Figure 6:
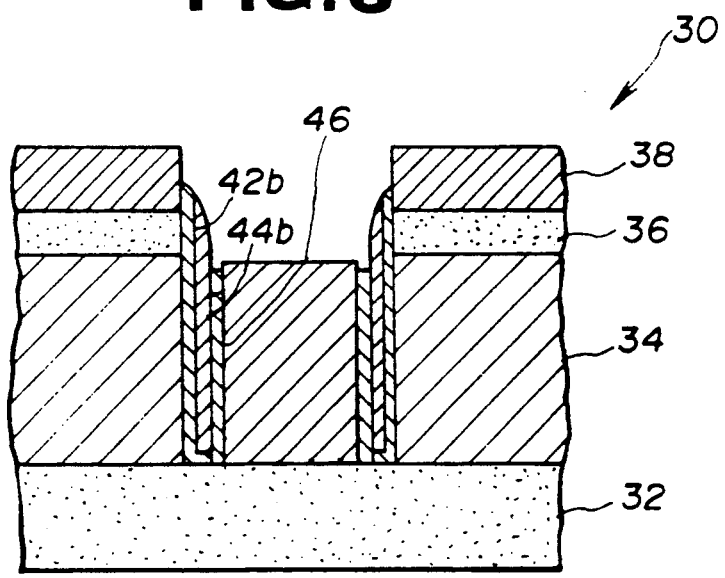

Then, as is seen from FIG. 6, an upper portions of the side wall portions of the SiO$_2$ film 46 are removed by, for example, plasma etching as an isotropic etching so as to expose the upper portions of the Ti and TiON films 42, 44. The plasma etching is conducted in accordance with, for example, the following conditions:

Source gases and their flow rates: CF$_4$ (50 SCCM), O$_2$ (5 SCCM) and Ar (45 SCCM);
Power: 600 W;
Temperature: 60° C.; and
Etching time: 2 min.

Then, as is seen from FIG. 7, tungsten 50 is selectively deposited by the aforementioned CVD method on the TiON film. This selective deposition is continued until an upper unfilled space of the through-hole 40 is substantially filled with tungsten 50. It should be noted that the upper unfilled space of the through-hole 40 has an aspect ratio which is much lower than that of the entire through-hole 40. Therefore, there is not produced at all a void space in the upper portion of the through-hole 40. Thus, the through-hole 40 is substantially totally filled with tungsten 48, 50. Therefore, the first and second conductive layers 32 and 36 are securely interconnected with each other through tungsten, and the Ti and TiON films 42, 44. It should be noted that the side surfaces of the second conductive layer 36 are covered with the Ti and TiON films 42, 44. Therefore, in the tungsten deposition by a CVD method or in the following annealing, the second conductive layer 36 will not eroded by the tungsten 50. With this, for example, undesirable junction failure of a transistor is not produced. Contact resistance between the second conductive layer 36 and the tungsten 50 becomes low due to the provision of the Ti and TiON films 42, 44 therebetween.

It is optional to use other materials besides polysilicon for the first and second conductive layers 32 and 36, and to use other materials besides SiO$_2$ for the first and second insulating layers 34 and 38.

It is optional to use another conductive material such as Al or polysilicon besides tungsten as long as it is selectively deposited by a CVD method.

It is optional to use another material for the Ti and TiON films 42, 44 as long as it has a low contact resistance relative to the second conductive layer 36 and to a conductive material such as tungsten with which the through-hole 40 is filled.

In the preferred embodiment of the present invention, two films consisting of Ti and TiON films 42, 44 are employed. However, according to the present invention, the number of the films is not limited to two.

According to the present invention, if desired, the Ti and TiON films 42, 44 can be omitted as long as a film on which the conductive material is not selectively deposited is used.

It is optional to another material for the SiO$_2$ film 46 as long as the conductive material is not selectively deposited thereon.

In stead of the deposition of the SiO$_2$ film 46 on the Ti and TiON films 42, 44 to mask the same, it is optional to oxidize or nitride the Ti and TiON films 42, 44 so as to prevent deposition of the conductive material thereon, and then to remove the oxidized or nitrided surfaces by an anisotropic etching followed by the conductive material deposition thereon.

It is optional to use another conductive material besides tungsten for filling the upper space of the through-hole 40 as long as it is low in electrical conductivity.

It is optional to apply the present invention to fill a contact-hole on a semiconductor substrate.

What is claimed is:

1. A method of forming a multilayer interconnection structure, said method comprising the following steps in the sequence:
   (a) depositing a first insulating layer on a first conductive layer, followed by the deposition of a second conductive layer on said first insulating layer;
   (b) depositing a second insulating layer on said second conductive layer;
   (c) forming a through-hole by opening said second insulating, second conductive and first insulating layers so as to expose a surface of said first conductive layer and two opposed surfaces of said second conductive layer, said through-hole having a first portion in which the surface of said first conductive layer is exposed and a second portion in which the two opposed surfaces of said second conductive layer are exposed;
   (d) masking the two opposed surfaces of said second conductive layer with a masking film, so as not to deposit thereon a conductive material which has a strong and selective adhesion on said first and second conductive layers;
   (e) depositing said conductive material on the surface of said first conductive layer by a selective chemical vapor deposition method so as to fill the first portion of said through-hole with said conductive material;
   (f) removing said masking film so as to expose the two opposed surfaces of said second conductive layer; and
   (g) depositing said conductive material on the two opposed surfaces of said second conductive layer by a chemical vapor deposition method so as to fill the second portion of said through-hole with said conductive material, such that said through-hole is substantially filled with said conductive material and that said first and second conductive layers are interconnected with each other.

2. A method according to claim 1, wherein said first and second conductive layers are made of one selected from the group consisting of Si and polycrystaline silicon.

3. A method according to claim 1, wherein said conductive material is tungsten.

4. A method according to claim 1, wherein said masking film is made of SiO$_2$.

5. A method according to claim 1, wherein said first and second insulating layers are made of SiO$_2$.

6. A method according to claim 1, wherein said through-hole is formed by photolithography and dry etching techniques.

7. A method according to claim 1, wherein in the step (d) said masking film is deposited on a major exposed surface of said second insulating layer, opposed wall portions of said through-hole and the surface of said first conductive layer.

8. A method according to claim 7, wherein between the steps (d) and (e) said masking film deposited on the major exposed surface of said second insulating layer and the surface of said first conductive layer is removed by an reactive ion etching.

9. A method according to claim 8, wherein in the step (f) two portions of said masking film deposited on the opposed wall portions of said through-hole are removed by an isotropic etching so as to expose the two opposed surfaces of said second conductive layer.

10. A method according to claim 1, wherein in the step (e) the deposition of said conductive material on the surface of said first conductive layer is continued until an end surface of the deposited conductive material reaches a position close to the opposed surfaces of said second conductive layer.

11. A method of forming a multilayer interconnection structure, said method comprising the following steps in the sequence:
 (a) depositing a first insulating layer on a first conductive layer, followed by the deposition of a second conductive layer on said first insulating layer;
 (b) depositing a second insulating layer on said second conductive layer;
 (c) forming a through-hole by opening said second insulating, second conductive and first insulating layers so as to expose a surface of said first conductive layer and two opposed surfaces of said second conductive layer, said through-hole having a first portion in which the surface of said first conductive layer is exposed and a second portion in which the two opposed surfaces of said second conductive layer are exposed;
 (d) masking the two opposed surfaces of said second conductive layer with a first masking film, so as to prevent erosion of said second conductive layer by a conductive material and to lower contact resistance between said second conductive layer and said conductive material;
 (e) masking said first masking film with a second masking film, so as not to deposit on said first masking film said conductive material which has a strong and selective adhesion on said first and second conductive layers and on said first masking film;
 (f) depositing said conductive material on the surface of said first conductive layer by a selective chemical vapor deposition method so as to fill the first portion of said through-hole with said conductive material;
 (g) removing said second masking film so as to expose said first masking film; and
 (h) depositing said conductive material on said first masking film by a chemical vapor deposition method so as to fill the second portion of said through-hole with said conductive material, such that said through-hole is substantially filled with said conductive material and that said first and second conductive layers are interconnected with each other.

12. A method according to claim 11, wherein said first masking film is made of a Ti layer and a TiON layer.

13. A method according to claim 11, wherein said second masking film is made of $SiO_2$.

* * * * *